(12) United States Patent
Guo et al.

(10) Patent No.: US 10,715,892 B2
(45) Date of Patent: Jul. 14, 2020

(54) ELECTRONIC DEVICE

(71) Applicant: AAC Technologies Pte. Ltd., Singapore (SG)

(72) Inventors: Shun Guo, Shenzhen (CN); Huan Ge, Shenzhen (CN); Hongxing Wang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/233,385

(22) Filed: Dec. 27, 2018

(65) Prior Publication Data

US 2019/0230423 A1 Jul. 25, 2019

(30) Foreign Application Priority Data

Jan. 19, 2018 (CN) .......................... 2018 1 0053579

(51) Int. Cl.
| | |
|---|---|
| *H04R 1/02* | (2006.01) |
| *H04M 1/02* | (2006.01) |
| *H04R 9/06* | (2006.01) |
| *F16F 15/00* | (2006.01) |
| *H01L 41/09* | (2006.01) |

(52) U.S. Cl.
CPC ............. *H04R 1/02* (2013.01); *F16F 15/005* (2013.01); *H01L 41/09* (2013.01); *H04M 1/0266* (2013.01); *H04R 9/06* (2013.01); *H04R 2400/11* (2013.01)

(58) Field of Classification Search
CPC ........ H04R 7/04; H04R 7/02; H04R 2400/11; H04R 1/02; H04M 1/0266; H04M 1/0295; H04M 1/0268
See application file for complete search history.

(56) References Cited

U.S. PATENT DOCUMENTS

| | | | |
|---|---|---|---|
| 2013/0250500 A1* | 9/2013 | Tossavainen | ........... G06F 3/016 361/679.01 |
| 2015/0169002 A1* | 6/2015 | Kemppinen | .......... G06F 1/1643 361/679.55 |

* cited by examiner

*Primary Examiner* — Sunita Joshi
(74) *Attorney, Agent, or Firm* — IPro, PLLC; Na Xu

(57) ABSTRACT

An electronic device is provided, including: a vibration plate; a frame structure supporting the vibration plate, the frame structure including an installation portion parallel to and opposite to the vibration plate and a border bent at an edge of the installation portion and extending along both sides of the installation portion. The vibration plate is supported on a side of the installation portion, and a preset gap is provided between the vibration plate and the border. The electronic device further includes a middle frame fixed between the installation portion and the vibration plate. The middle frame is fixedly connected to the vibration plate, an actuator is fixed to the middle frame and drives the middle frame so that the middle frame drives the vibration plate to vibrate and sound. The electronic device further includes a damper sandwiched between the middle frame and the installation portion.

8 Claims, 3 Drawing Sheets

ELECTRONIC DEVICE

CROSS-REFERENCE TO RELATED APPLICATIONS

The present application claims priority to Chinese Patent Application No. 201810053579.6 filed on Jan. 19, 2018, the content of which is incorporated herein by reference in its entirety.

TECHNICAL FIELD

The present disclosure relates to the field of electronic technologies, and in particular, to an electronic device.

BACKGROUND

With a wide application of electronic devices such as mobile phones and tablet computers in people's daily life, people have higher and higher requirements on safety performances of these electronic devices in which waterproofness is an important one. In the related art, there is a vibration sounding technology, in which a driver is used to drive a housing and a screen of the electronic device to vibrate together so as to sound. Compared with sounding of the conventional speaker, in the technique of utilizing the vibration of the housing to sound, it is not necessary to provide a sounding hole on the housing, thereby greatly improving the waterproofness of the electronic device.

However, the inventors of the present disclosure have found that, although the existing vibration sounding technology can greatly improve the waterproofness of the electronic device, when the electronic device sounds, the vibration sound may cause the frame of the electronic device to vibrate at the same time. At this time, users holding the electronic device may feel the vibration, thereby affecting the user experience.

DESCRIPTION OF EMBODIMENTS

In order to better understand objectives, technical solutions and advantages of the present disclosure, embodiments of the present disclosure are described in details with reference to the accompanying drawings. However, it will be apparent to those skilled in the art that, in the various embodiments of the present disclosure, a number of technical details are set forth in order to provide a better understanding of the present disclosure. However, the technical solutions described in the present disclosure can be implemented without these technical details and various changes and modifications can be made on the basis of the following embodiments.

Figure 1:
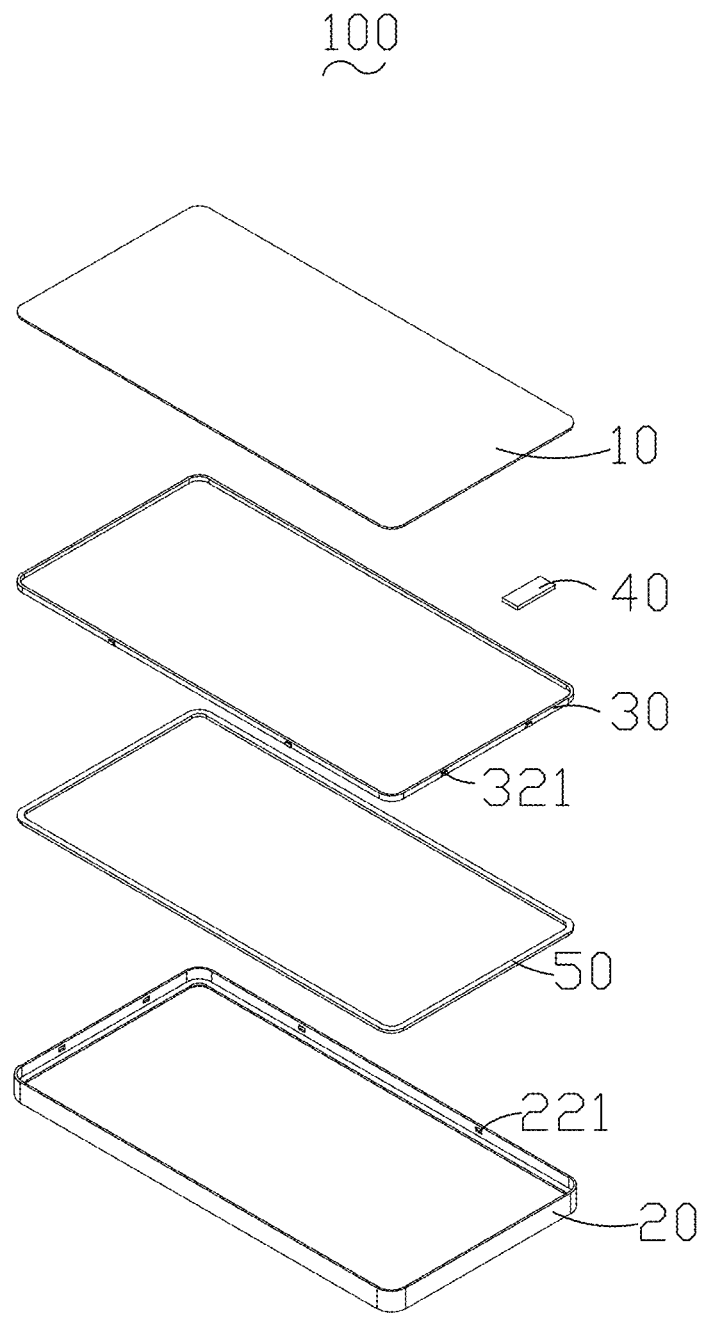
FIG. 1 is an exploded perspective view showing a three-dimensional structure of an electronic device according to a first embodiment of the present disclosure.
Figure 2:
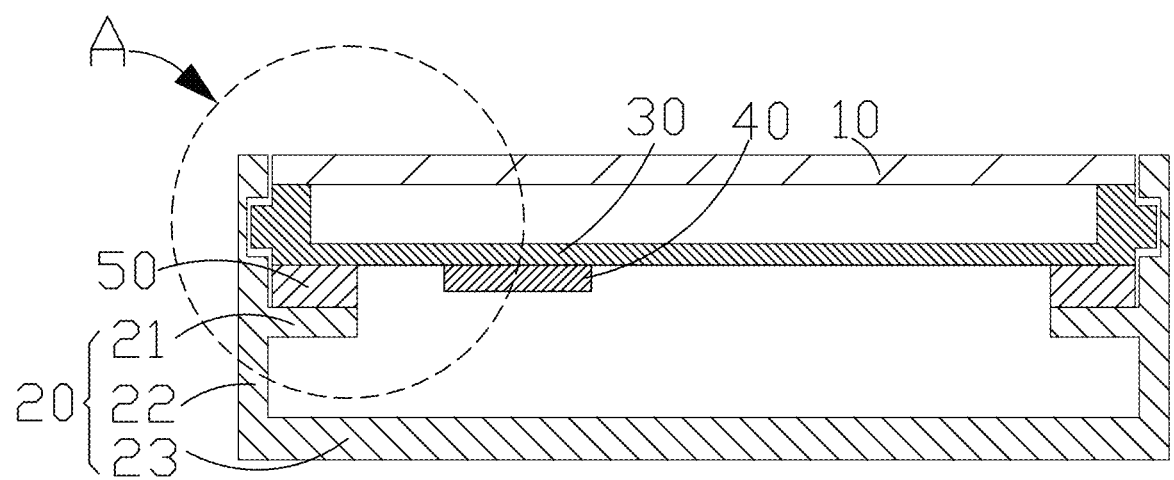
FIG. 2 is a schematic cross-sectional structural view showing an electronic device according to the first embodiment of the present disclosure.
Figure 3:
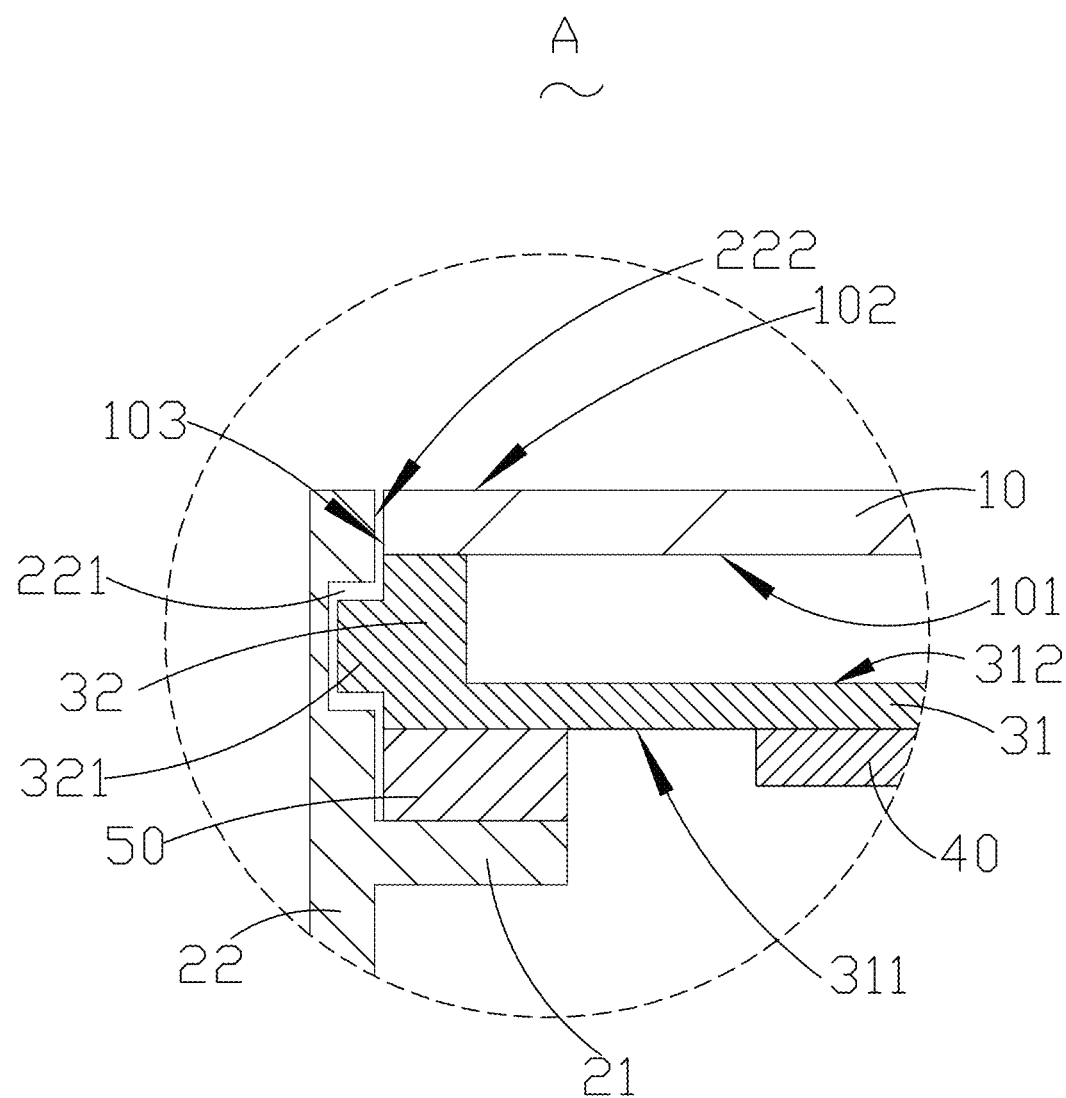
FIG. 3 is an enlarged view showing a portion A in FIG. 2.

A first embodiment of the present disclosure relates to an electronic device 100. As shown in FIGS. 1 and 2, the electronic device 100 includes a vibration plate 10 and a frame structure 20 supporting the vibration plate 10. In one embodiment, the frame structure 20 and the vibration plate 10 are cooperated with each other and fixed together, thereby constituting an outer structure of the electronic device 100. As shown in FIG. 3, the frame structure 20 includes an installation portion 21 and a border 22. The installation portion 21 is parallel to and opposite to the vibration plate 10. The border 22 is bended to extend along both sides of the installation portion 21. The vibration plate 10 is supported on a side of the installation portion 21, and there is a preset gap between the vibration plate 10 and the border 22. A middle frame 30 is fixed between the installation portion 21 and the vibration plate 10. The middle frame 30 is fixedly connected to the vibration plate 10. An actuator 40 is fixed to the middle frame 30, and drives the middle frame 30 so that the vibration plate 10 driven by the middle frame 30 is vibrated to sound. A damper 50 is sandwiched between the middle frame 30 and the installation portion 21. The actuator 40 can be a piezoelectric actuator, or an electromagnetic actuator including a stator and a vibrator.

Compared with the related art, in an embodiment of the present disclosure, a preset gap is left between the vibration plate 10 and the border 22, so that vibration cannot be directly transmitted to the border 22 when the vibration plate 10 vibrates to sound. Meanwhile, because a damper 50 is sandwiched between the middle frame 30 and the installation portion 21, and damping effect of the damper can reduce the vibration transmitted to the installation portion 21 when the middle frame 30 is vibrating. After the vibration transmitted to the frame structure 20 is reduced by the damper 50, the vibration transmitted to the frame structure 20 is very small, thereby significantly reducing the vibration at the frame structure of the electronic device and avoiding the influence to the user experience.

The specific structure of the electronic device 100 provided by the embodiments of the present disclosure is further described in detail below, but the description is merely a possible implementation of the present disclosure. In practical applications, it may be modified and is not limited to the specific structures described below.

Optionally, in an embodiment of the present disclosure, the middle frame 30 includes a mainboard 31 disposed opposite to the vibration plate 10, and a support plate 32 extending from an edge of the mainboard 31 to the vibration plate 10. The support plate 32 is fixedly connected to the vibration plate 10. Meanwhile, a damper 50 is sandwiched between the middle frame 22 and the installation portion 21, and the middle frame 30 is fixedly connected to the frame structure 20 by the damper 50. Meanwhile, the middle frame 30 is fixedly connected to both the vibration plate 10 and the frame structure 20 so as to fixedly connect the three together.

Further, a first position limiting portion 321 is formed on a side of the supporting plate 32 adjacent to the border 22. A second position limiting portion 221 is formed at a position of the border 22 opposite to the first position limiting portion 321. The first position limiting portion 321 and the second position limiting portion 221 are correspondingly disposed. In one embodiment, the first position limiting portion 321 can be a position limiting groove or a position limiting pillar, and the second position limiting portion 221 can also be a position limiting groove or a position limiting pillar, but the first position limiting portion 321 and the second position limiting portion 322 are different. That is, when the first position limiting portion 321 is a position limiting pillar, the second position limiting portion 221 is a position limiting groove; alternatively, when the first position limiting portion 321 is a position limiting groove, the second position limiting portion 221 is a position limiting pillar. Cooperation of the position limiting pillar and the position limiting groove can define the middle frame 30 within the frame structure 20. When the middle frame 30 vibrates frequently to sound, even if the fixation between the middle frame 30 and the frame structure 20 by the damper 50 is loosened or even detached, the design of the position limiting groove and the position limiting pillar of the position limiting portion 321 and the second position limiting portion 221 can also prevent the middle frame 30 from detaching off the frame structure 20, thereby increasing the stability and reliability of the electronic device 100. Meanwhile, a gap is left between the first position limiting portion 321 and the second position limiting portion 221. In case that a gap is left between the first position limiting portion 321 and the second position limiting portion 221, no matter which one of the first position limiting portion 321 and the second position limiting portion 221 is the position limiting pillar or the position limiting groove, vibration will not be directly transmitted to the border 22 through the connection so as to reduce the vibration of the border 22 when the middle frame 30 is vibrating.

In an embodiment of the present disclosure, the vibration plate 10 is a display screen. The vibration plate 10 may be a display screen for displaying images and colors, or may also be a display module including a touch screen and a display screen. The middle frame 30 can be made of plastic or glass, metal, or other materials that can be used in the electronic device. The middle frame 30 is driven by the actuator 40, and the vibration plate 10 is vibrated by the middle frame 30 to sound, so that the display screen originally only used for display can also sound. Therefore, the function of the screen in conventional cases is not only expanded, but also the hole structure for sounding in the existing sounding device can be omitted, thus improving the waterproof function of the electronic device.

In one embodiment, the vibration plate 10 includes a lower surface 101 adjacent to the middle frame 30 and connected to the middle frame 30, an upper surface 102 disposed opposite to the lower surface 101 and facing away from the middle frame 30, and an outer periphery 103 connected to the upper surface 102 and the lower surface 101. The outer periphery 103 is opposite to and spaced apart from an inner side wall 222 of the border 22. The outer periphery 103 is opposite to and spaced apart from the inner side wall 222 of the border 22, such that the vibration plate 10 is not in direct contact with the border 22. Therefore, the vibration cannot be directly transmitted to the border 22 when the vibration plate 10 sounds, so that the vibration of the frame structure 20 is reduced when the electronic device 100 sounds.

In an embodiment of the present disclosure, the mainboard 31 includes a bottom surface 311 facing away from the vibration plate 10, and a top surface 312 disposed opposite to the bottom surface 311 and connected to the vibration plate 10. In an embodiment of the present disclosure, the piezoelectric actuator 40 is fixed to the bottom surface 311. It can be understood that the piezoelectric actuator 40 can also be disposed on the top surface 312 or disposed on the lower surface 101 of the vibration plate 10, no matter where the piezoelectric actuator 40 is disposed, the actuator 40 can directly or indirectly drive the vibration plate 10 to vibrate and sound. Optionally, an orthographic projection of the support portion 32 and the installation portion 21 on the mainboard 31 and an orthographic projection of the actuator 40 on the mainboard 31 do not overlap each other. Since the damper 50 is sandwiched between the middle frame 30 and the installation portion 21, the orthographic projections on the mainboard 31 do not overlap each other, so that the actuator 40 and the damper 50 are not in contact with each other. Therefore, the actuator 40 is prevented from directly transmitting vibration to the damper 50, and the vibration of the border 22 is reduced.

In an embodiment of the present disclosure, the damper 50 is disposed surrounding the installation portion 21. It can be understood that the damper 50 can also be a plurality of damper blocks discretely distributed on the installation portion 21, which does not affect the vibration damping effect. It is worth mentioning that a ratio of the Young's modulus of the damper 50 to the thickness of the damper 50 in the vibration direction of the vibration plate 10 is no more than 2 MPa/mm. The smaller the stiffness coefficient K of the damper 50 in the vibration direction of the vibration plate 10 is, the better the vibration damping effect is. However, the thickness D of the damper 50 in the vibration direction of the vibration plate 10 is in negative correlation to K, and the Young's modulus is in positive correlation to K. Studies have shown that when the ratio Y/D between the Young's modulus Y and the thickness D is smaller than or equal to 2 MPa/mm, the best damping effect of the damper 50 can be obtained, thereby achieving the best vibration damping effect, and avoiding the influence to the user experience.

A person skilled in the art can understand that the above embodiments are specific embodiments for implementing the present disclosure, and various changes can be made in practical application without departing from the spirit and scope of the present disclosure.

What is claimed is:

1. An electronic device, comprising, a vibration plate; and a frame structure supporting the vibration plate, wherein the frame structure comprises: an installation portion parallel to and opposite to the vibration plate; a border bent at an edge of the installation portion and extending along both sides of the installation portion, the vibration plate being supported on a side of the installation portion, and a preset gap being provided between the vibration plate and the border; and a middle frame fixed between the installation portion and the vibration plate, the middle frame being fixedly connected to the vibration plate, and an actuator being fixed to the middle frame and configured to drive the middle frame in such a manner that the middle frame drives the vibration plate to vibrate and sound; and a damper sandwiched between the middle frame and the installation portion; wherein the middle frame comprises a mainboard disposed oppositely to the vibration plate and a supporting plate extending from an edge of the mainboard to the vibration plate, the supporting plate is fixedly connected to the vibration plate, and the actuator is fixed to a side of the supporting plate facing away from the vibration plate; the actuator is fixed to a surface of the mainboard facing away from the vibration plate, and an orthographic projection of the support plate and the installation portion on the mainboard does not overlap with an orthographic projection of the actuator on the mainboard.

2. The electronic device according to claim 1, wherein the middle frame comprises a first position limiting portion formed on a side of the supporting plate close to the border, and a second position limiting portion matching with the first position limiting portion is formed on the border.

3. The electronic device according to claim 2, wherein the first position limiting portion is a position limiting pillar protruding from a surface of the supporting plate, and the second position limiting portion is a position limiting groove matching with the position limiting pillar; or, the first position limiting portion is a position limiting groove recessed from the surface of the supporting plate, and the second position limiting portion is a position limiting pillar matching with the position limiting groove.

4. The electronic device according to claim 3, wherein the vibration plate is a display screen, and the frame structure further comprises a back housing fixed to a side of the border facing away from the vibration plate.

5. The electronic device according to claim 1, wherein the display screen comprises a lower surface adjacent to the middle frame and connected to the middle frame, an upper surface disposed oppositely to the lower surface and facing away from the middle frame, and an outer periphery connected to the upper surface and the lower surface, and the outer periphery is opposite to and spaced apart from an inner side wall of the border.

6. The electronic device according to claim 3, wherein a gap is reserved between the position limiting pillar and the position limiting groove.

7. The electronic device according to claim 1, wherein a ratio of Young's modulus of the damper to a thickness of the damper in a vibration direction of the vibration plate is smaller than or equal to 2 MPa/mm.

8. The electronic device according to claim 1, wherein the actuator comprises a piezoelectric actuator and/or an electromagnetic actuator.

* * * * *